United States Patent
Kurita et al.

(10) Patent No.: US 8,216,422 B2
(45) Date of Patent: *Jul. 10, 2012

(54) SUBSTRATE SUPPORT BUSHING

(75) Inventors: Shinichi Kurita, San Jose, CA (US);
Suhail Anwar, San Jose, CA (US);
Toshio Kiyotake, Hyogo (JP)

(73) Assignee: Applied Materials, Inc., Santa Clara, CA (US)

( * ) Notice: Subject to any disclaimer, the term of this patent is extended or adjusted under 35 U.S.C. 154(b) by 1456 days.

This patent is subject to a terminal disclaimer.

(21) Appl. No.: 11/044,245

(22) Filed: Jan. 27, 2005

(65) Prior Publication Data

US 2005/0220604 A1   Oct. 6, 2005

Related U.S. Application Data

(63) Continuation of application No. 10/779,130, filed on Feb. 12, 2004.

(51) Int. Cl.
 *C23C 16/00* (2006.01)
 *C23C 16/458* (2006.01)
 *H01L 21/3065* (2006.01)
 *G01V 8/00* (2006.01)

(52) U.S. Cl. ........... 156/345.54; 156/345.1; 156/345.31; 118/728; 118/729; 414/806; 384/32; 384/50; 384/51; 384/470; 384/509; 384/523; 384/525

(58) Field of Classification Search .......... 414/806; 118/728, 729; 384/32, 50, 51, 470, 509, 384/523, 525; 156/345.1, 345.31, 345.54

See application file for complete search history.

(56) References Cited

U.S. PATENT DOCUMENTS

| | | | | |
|---|---|---|---|---|
| 2,889,180 A | * | 6/1959 | Jorgensen | 384/52 |
| 2,907,610 A | * | 10/1959 | Wise | 384/55 |
| 2,983,553 A | * | 5/1961 | Dexter | 384/52 |
| 3,269,128 A | | 8/1966 | Rusche | |
| 3,347,603 A | | 10/1967 | Ignatjev | |
| 3,582,161 A | * | 6/1971 | Hudson | 384/51 |
| 3,589,202 A | * | 6/1971 | Stanley | 74/25 |
| 3,622,211 A | * | 11/1971 | Mitton | 384/56 |
| 3,887,247 A | | 6/1975 | Graae et al. | |
| 4,265,320 A | * | 5/1981 | Tanaka et al. | 173/178 |

(Continued)

FOREIGN PATENT DOCUMENTS

EP   1 213 238 A1   6/2002

(Continued)

OTHER PUBLICATIONS

Translation of JP 2003-124297 A.*

(Continued)

*Primary Examiner* — Jeffrie R Lund
(74) *Attorney, Agent, or Firm* — Patterson & Sheridan, LLP

(57) ABSTRACT

An apparatus for supporting a substrate within a processing chamber is provided. In one aspect, a substrate support member is provided comprising a housing having a bore formed therethrough, a support pin at least partially disposed within the bore, and a plurality of bearing elements disposed about the housing. In one aspect, the bearing elements comprise a roller having a central bore formed therethrough, a contoured outer surface, and a shaft at least partially disposed through the central bore. In another aspect, the bearing elements comprise a ball assembly comprising a larger spherical member and four smaller spherical members arranged about the larger spherical member.

9 Claims, 13 Drawing Sheets

U.S. PATENT DOCUMENTS

| | | | |
|---|---|---|---|
| 4,334,436 A * | 6/1982 | Bonzack | 74/44 |
| 4,346,945 A | 8/1982 | Tsuboi | |
| 4,382,739 A * | 5/1983 | Mack et al. | 414/217 |
| 4,579,396 A * | 4/1986 | Moser | 384/49 |
| 4,621,936 A | 11/1986 | Hansson et al. | |
| 4,635,452 A * | 1/1987 | Agbay | 70/34 |
| 4,736,508 A | 4/1988 | Poli et al. | |
| 4,765,273 A | 8/1988 | Anderle | 118/729 |
| 4,842,683 A * | 6/1989 | Cheng et al. | 156/345.37 |
| 4,848,814 A | 7/1989 | Suzuki et al. | |
| 4,958,061 A | 9/1990 | Wakabayashi et al. | |
| 5,160,238 A * | 11/1992 | Kambara | 414/663 |
| 5,236,264 A * | 8/1993 | Matsubara et al. | 384/49 |
| 5,238,499 A * | 8/1993 | van de Ven et al. | 118/724 |
| 5,324,119 A * | 6/1994 | Harimoto et al. | 384/548 |
| 5,356,476 A * | 10/1994 | Foster et al. | 118/725 |
| 5,370,739 A * | 12/1994 | Foster et al. | 118/725 |
| 5,437,440 A * | 8/1995 | Keaton | 269/24 |
| 5,445,486 A | 8/1995 | Kitayama et al. | |
| 5,605,574 A | 2/1997 | Tsunashima et al. | |
| 5,622,434 A * | 4/1997 | Takahashi | 384/49 |
| 5,674,786 A | 10/1997 | Turner et al. | |
| 5,677,824 A | 10/1997 | Harashima et al. | |
| 5,707,153 A * | 1/1998 | Steinberger et al. | 384/49 |
| 5,718,574 A | 2/1998 | Shimazu | |
| 5,772,833 A * | 6/1998 | Inazawa et al. | 156/345.47 |
| 5,788,304 A | 8/1998 | Korn et al. | |
| 5,796,066 A * | 8/1998 | Guyot | 219/121.48 |
| 5,836,575 A | 11/1998 | Robinson et al. | |
| 5,844,195 A * | 12/1998 | Fairbairn et al. | 219/121.43 |
| 5,850,071 A | 12/1998 | Makiguchi et al. | |
| 5,893,647 A | 4/1999 | Mochizuki | |
| 5,931,631 A | 8/1999 | Bonora et al. | |
| 5,984,391 A | 11/1999 | Vanderpot et al. | |
| 6,077,026 A | 6/2000 | Shultz | |
| 6,085,670 A | 7/2000 | Genov | |
| 6,091,498 A | 7/2000 | Hanson et al. | |
| 6,110,285 A | 8/2000 | Kitazawa et al. | |
| 6,118,100 A * | 9/2000 | Mailho et al. | 219/390 |
| 6,120,609 A * | 9/2000 | Selyutin et al. | 118/728 |
| 6,143,147 A | 11/2000 | Jelinek | |
| 6,146,504 A | 11/2000 | Patadia et al. | |
| 6,170,433 B1 * | 1/2001 | Du Bois | 118/725 |
| 6,174,370 B1 * | 1/2001 | Yoshida | 118/500 |
| 6,187,134 B1 | 2/2001 | Chow et al. | |
| 6,193,506 B1 | 2/2001 | Muka | |
| 6,200,634 B1 * | 3/2001 | Johnsgard et al. | 427/248.1 |
| 6,213,704 B1 | 4/2001 | White et al. | |
| 6,235,121 B1 * | 5/2001 | Honma et al. | 118/730 |
| 6,240,797 B1 * | 6/2001 | Morishima et al. | 74/89.39 |
| 6,250,619 B1 * | 6/2001 | Cook et al. | 269/20 |
| 6,256,555 B1 | 7/2001 | Bacchi et al. | |
| 6,257,827 B1 | 7/2001 | Hendrickson et al. | |
| 6,322,116 B1 | 11/2001 | Stevens | |
| 6,343,183 B1 | 1/2002 | Halpin et al. | |
| 6,345,150 B1 | 2/2002 | Yoo | |
| 6,371,716 B1 | 4/2002 | Byunn et al. | |
| 6,378,816 B1 * | 4/2002 | Pfister | 248/161 |
| 6,452,195 B1 | 9/2002 | Smick et al. | |
| 6,528,767 B2 | 3/2003 | Bagley et al. | |
| 6,568,853 B2 | 5/2003 | Mochizuki | |
| 6,596,086 B1 * | 7/2003 | Honma et al. | 118/728 |
| 6,752,532 B2 | 6/2004 | Mochizuki | |
| 6,753,507 B2 * | 6/2004 | Fure et al. | 219/444.1 |
| 6,772,710 B2 * | 8/2004 | Lee | 118/723 HC |
| 6,887,317 B2 * | 5/2005 | Or et al. | 118/728 |
| 6,935,466 B2 * | 8/2005 | Lubomirsky et al. | 187/250 |
| 7,083,702 B2 * | 8/2006 | Blonigan et al. | 156/345.47 |
| 8,033,245 B2 * | 10/2011 | Kurita et al. | 118/723 E |
| 2001/0039917 A1 * | 11/2001 | Arai et al. | 117/89 |
| 2002/0011204 A1 * | 1/2002 | Gujer et al. | 118/500 |
| 2002/0124706 A1 * | 9/2002 | Mochizuki | 83/824 |
| 2002/0159658 A1 * | 10/2002 | Hirose | 384/50 |
| 2002/0187262 A1 * | 12/2002 | Rocha-Alvarez et al. | 427/255.27 |
| 2003/0010358 A1 * | 1/2003 | Krolak | 134/21 |
| 2003/0026646 A1 * | 2/2003 | Mochizuki | 403/231 |
| 2003/0067180 A1 | 4/2003 | Hosokawa | |
| 2003/0072639 A1 | 4/2003 | White et al. | |
| 2003/0164362 A1 | 9/2003 | Bagley et al. | |
| 2004/0041322 A1 * | 3/2004 | Bode | 269/24 |
| 2004/0170407 A1 | 9/2004 | Nguyen et al. | |
| 2004/0250955 A1 * | 12/2004 | Blonigan et al. | 156/345.51 |
| 2005/0180737 A1 * | 8/2005 | Kurita et al. | 392/418 |
| 2005/0220604 A1 * | 10/2005 | Kurita et al. | 414/806 |
| 2006/0016398 A1 * | 1/2006 | Dubost et al. | 118/728 |
| 2006/0231029 A1 * | 10/2006 | Blonigan et al. | 118/722 |
| 2008/0019623 A1 * | 1/2008 | Otsuka | 384/51 |
| 2009/0279814 A1 * | 11/2009 | Yang | 384/44 |

FOREIGN PATENT DOCUMENTS

| | | |
|---|---|---|
| EP | 1 215 406 A1 | 6/2002 |
| EP | 1 283 544 A2 | 12/2003 |
| EP | 1 564 791 A2 * | 8/2005 |
| GB | 558 935 | 1/1944 |
| GB | 775 402 | 5/1957 |
| GB | 2 277 560 | 2/1994 |
| JP | 06-241231 | 8/1994 |
| JP | 06241231 | 8/1994 |
| JP | 09-129567 | 5/1997 |
| JP | 11204430 | 7/1999 |
| JP | 11351250 | 12/1999 |
| JP | 2000-091406 | 3/2000 |
| JP | 2000-150402 | 5/2000 |
| JP | 2002-213444 | 7/2002 |
| JP | 2003-124297 A | 4/2003 |
| WO | WO 89/03276 | 4/1989 |
| WO | WO 02/095808 | 11/2002 |

OTHER PUBLICATIONS

European Search Report for 04026466.5-2203, dated Jul. 7, 2006.
Notice of Reasons for Rejection issued Sep. 16, 2008 in Japanese Patent Application No. 2005-010725.
Applied Materials Infringement Action Brief, Dated Apr. 7, 2008.
Applied Materials Infringement Action Brief, Dated Apr. 23, 2009.
Applied Materials Infringement Action Brief, Dated May 9, 2008.
Applied Materials Infringement Action Brief, Dated Nov. 8, 2008.
Applied Materials Infringement Action Complaint, Dated Aug. 13, 2007.
Applied Materials Infringement Action Court Decision, Dated Jul. 27, 2009.
Applied Materials Infringement Action Court Decision, Dated Nov. 27, 2008.
Applied Materials Infringement Action Exhibit No. Kap-5 Affidavit.
Applied Materials Infringement Action Exhibit No. Kap-5 Affidavit_KR Translation.
Applied Materials Infringement Action Exhibit No. Kap-6 Affidavit.
Applied Materials Infringement Action Exhibit Nos. Kap-1.
Applied Materials Infringement Action Exhibit Nos. Kap-2.
Applied Materials Infringement Action Exhibit Nos. Kap-3.
Applied Materials Infringement Action Exhibit Nos. Kap-4.
Applied Materials Infringement Action Notice of Appeal, Dated Dec. 26, 2008.
Applied Materials Infringement Action Opposing Party Brief, Dated Apr. 3, 2008.
Applied Materials Infringement Action Opposing Party Brief, Dated Aug. 8, 2008.
Applied Materials Infringement Action Opposing Party Brief, Dated Feb. 13, 2008.
Applied Materials Infringement Action Opposing Party Brief, Dated Jul. 3, 2009.
Applied Materials Infringement Action Opposing Party Brief, Dated Jun. 8, 2009.
Applied Materials Infringement Action Opposing Party Brief, Dated Jun. 30, 2008.
Applied Materials Infringement Action Opposing Party Brief, Dated Mar. 7, 2008.
Applied Materials Infringement Action Opposing Party Brief, Dated May 26, 2009.
Applied Materials Infringement Action Opposing Party Brief, Dated Oct. 8, 2008.

Applied Materials Infringement Action Opposing Party Exhibit No. Eul-13 Patent Court Invalidation Decision.
Applied Materials Infringement Action Opposing Party Exhibit No. Eul-14 Patent Court Scope Confirmation Decision.
Applied Materials Infringement Action Opposing Party Exhibit Nos. Eul-6.
Applied Materials Infringement Action Opposing Party Exhibit Nos. Eul-8.
Applied Materials Infringement Action Opposing Party Exhibit Nos. Eul-12 KIPO Decision.
Applied Materials Infringement Action Opposing Party Petition for Security Deposit, Dated Sep. 28, 2007.
Applied Materials Infringement Action Opposing Party Reference Material 1.
Applied Materials Infringement Action Opposing Party Reference Material 2.
Applied Materials Infringement Action Opposing Party Response Brief, Dated Oct. 30, 2007.
Applied Materials Infringement Action Petition for Confirmation of Facts for Third Party, Dated Aug. 8, 2008.
Applied Materials Infringement Action Petition for Confirmation of Facts, Dated Jun. 12, 2008.
Applied Materials Infringement Action Petition for Production of Documents, Dated Aug. 8, 2008.
Applied Materials Infringement Action Petition for Site Inspection, Dated Sep. 25, 2008.
Applied Materials Infringement Action Reference Material 1.
Applied Materials Infringement Action Third Party Response, Dated Aug. 26, 2008.
Applied Materials Infringement Action Third Party Response, Dated Jul. 22, 2008.
Applied Materials Infringement Action Third Party Response, Dated Jul. 29, 2008.
Applied Materials Infringement Action Third Party Response, Dated Jun. 30, 2008.
Applied Materials Infringement Action Opposing Party Exhibit Nos. Eul-7.
Applied Materials Invalidation Action Appeal Brief, Dated Jul. 20, 2009.
Applied Materials Invalidation Action Appeal Brief, Dated Nov. 4, 2008.
Applied Materials Invalidation Action Brief, Dated Apr. 3, 2009.
Applied Materials Invalidation Action Brief, Dated Dec. 10, 2008.
Applied Materials Invalidation Action Brief, Dated Mar. 17, 2009.
Applied Materials Invalidation Action Brief, Dated May 12, 2009.
Applied Materials Invalidation Action Brief, Dated May 19, 2009.
Applied Materials Invalidation Action Court Decision, Dated May 28, 2009.
Applied Materials Invalidation Action Opposing Party Presentation Material, Dated Apr. 7, 2009.
Applied Materials Invalidation Corrected Specification, dated Jan. 28, 2008.
Applied Materials Invalidation Action Petition for Correction dated Jan. 28, 2008.
Applied Materials Invalidation Action Response Brief, dated Jan. 28, 2008.
Applied Materials Invalidation Action Presentation Material, dated May 16, 2008.
Applied Materials Invalidation Action Second Brief, dated Jul. 24, 2008.
Applied Materials Invalidation Action Reference Material No. 1.
Applied Materials Invalidation Action Reference Material No. 2.
Applied Materials Invalidation Action Exhibit No. Eul-1 KT Affidavit.
Applied Materials Invalidation Action Exhibit No. Eul-2.
Applied Materials Invalidation Action Opposing Party Petition, dated Oct. 29, 2007.
Applied Materials Invalidation Action Opposing Party Brief, dated May 14, 2008.
Applied Materials Invalidation Action Opposing Party Exhibit No. Kap-1.
Applied Materials Invalidation Action Opposing Party Exhibit No. Kap-2.
Applied Materials Invalidation Action Opposing Party Exhibit No. Kap-3_KT Translation.
Applied Materials Invalidation Action Opposing Party Exhibit No. Kap-8-3_KR Translation.
Applied Materials Invalidation Action Opposing Party Exhibit No. Kap-9.
Applied Materials Invalidation Action Opposing Party Exhibit No. Kap-10_KR Translation.
Applied Materials Invalidation Action Opposing Party Exhibit No. Kap-11_KR Translation.
Applied Materials Invalidation Action Opposing Party Reference Material No. 1.
Applied Materials Invalidation Action Opposing Party Reference Material No. 2.
Applied Materials Invalidation Action Opposing Party Reference Material No. 3.
Applied Materials Invalidation Action Reference Material No. 3.
Applied Materials Invalidation Action KIPO Decision, dated Sep. 30, 2008.
Applied Materials Invalidation Action Exhibit No. Kap-1.
Applied Materials Invalidation Action Exhibit No. Kap-4 Cited Reference 1_KR Translation.
Applied Materials Invalidation Action Exhibit No. Kap-5 Cited Reference 2_KR Translation.
Applied Materials Invalidation Action Exhibit No. Kap-6 Cited Reference 3_KR Translation.
Applied Materials Invalidation Action Exhibit No. Kap-7 Cited Reference 4_KR Translation.
Applied Materials Invalidation Action Exhibit No. Kap-8 KT affidavit.
Applied Materials Invalidation Action Exhibit No. Kap-9.
Applied Materials Invalidation Action Exhibit No. Kap-10 Koji Ota affidavit.
Applied Materials Invalidation Action Opposing Party Exhibit No. Eul-1.
Applied Materials Invalidation Action Opposing Party Exhibit No. Eul-2 (Cited Reference) _KR Translation.
Applied Materials Invalidation Action Reference Material 1.
Applied Materials Invalidation Action Reference Material 2.
Applied Materials Invalidation Action Opposing Party Response Brief, dated Aug. 21, 2009.
Applied Materials Invalidation Action Supreme Court Decision, dated Sep. 16, 2009.
Applied Materials Invalidation Action Opposing Party Brief, dated Jan. 9, 2009.
Applied Materials Invalidation Action Notice of Appeal, dated Jun. 16, 2009.
Applied Materials Invalidation Action Exhibit No. Kap-11-1.
Applied Materials Invalidation Action Exhibit No. Kap-11-2.
Applied Materials Invalidation Action Exhibit No. Kap-3 KIPO Decision.
Applied Materials Invalidation Action Opposing Party Brief, dated May 14, 2009.
Applied Materials Invalidation Action Presentation Material, Dated Apr. 7, 2009.
Applied Materials Invalidation Action Opposing Party Presentation Material, Dated May 16, 2008.
Applied Materials Scope Confirmation Action Exhibit Nos. Kap-1.
Applied Materials Scope Confirmation Action Exhibit Nos. Kap-4.
Applied Materials Scope Confirmation Action KIPO Decision, Dated Jan. 30, 2008.
Applied Materials Scope Confirmation Action Opposing Party Response Brief, Dated Oct. 19, 2007.
Applied Materials Scope Confirmation Action Petition, Dated Aug. 13, 2007.
Applied Materials Scope Confirmation Action Appeal Brief, Dated Mar. 5, 2008.
Applied Materials Scope Confirmation Action Brief, Dated Apr. 3, 2008.
Applied Materials Scope Confirmation Action Brief, Dated Jun. 23, 2008.
Applied Materials Scope Confirmation Action Court Decision, Dated Jun. 25, 2009.

Applied Materials Scope Confirmation Action Exhibit No. Kap-1.
Applied Materials Scope Confirmation Action Exhibit No. Kap-3.
Applied Materials Scope Confirmation Action Exhibit No. Kap-6 News Article.
Applied Materials Scope Confirmation Action Opposing Party Brief, Dated Apr. 25, 2008.
Applied Materials Scope Confirmation Action Opposing Party Brief, Dated Oct. 15, 2008.
Applied Materials Scope Confirmation Action Opposing Party Exhibit No. Eul-1.
Applied Materials Scope Confirmation Action Opposing Party Exhibit No. Eul-2.
Applied Materials Scope Confirmation Action Petition for Third Party Site Inspection, Dated Oct. 10, 2008.
Applied Materials Scope Confirmation Action Reference Material 1.
Applied Materials Invalidation Action Exhibit No. Kap-5.
Decision on Rejection mailed Dec. 11, 2009 in CN 200410077194.1.
Korean Notice of Preliminary Rejection dated Aug. 19, 2010 for Korean Application No. 10-2005-50315.

* cited by examiner

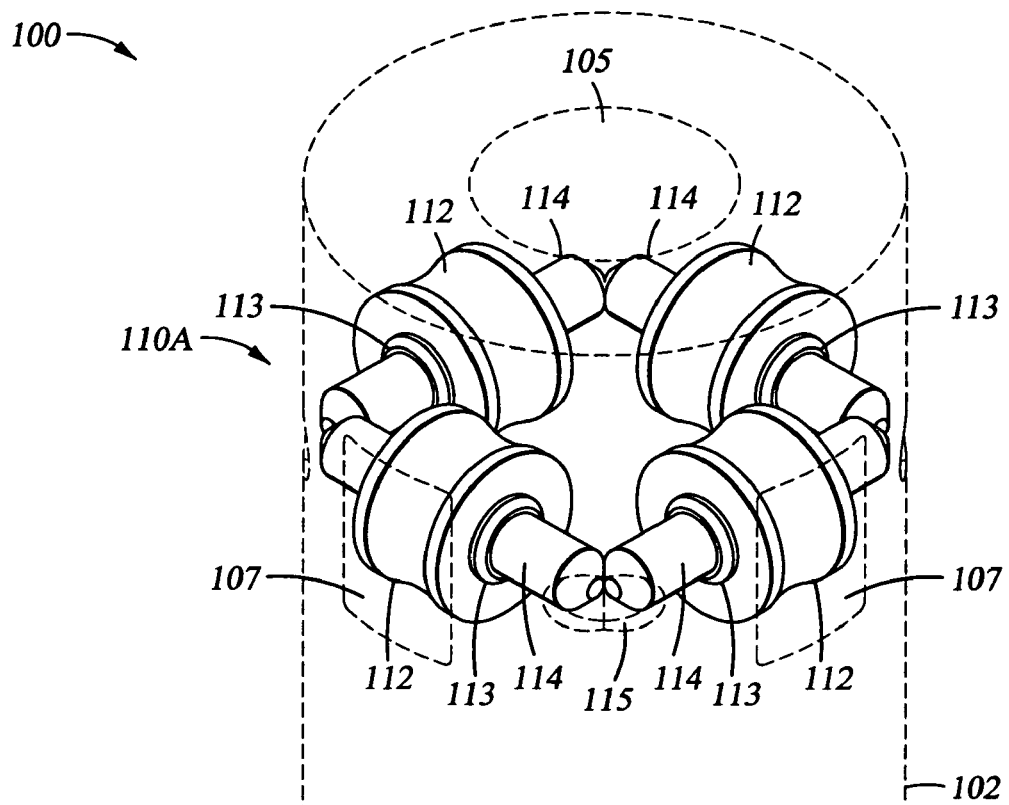
Fig. 1C
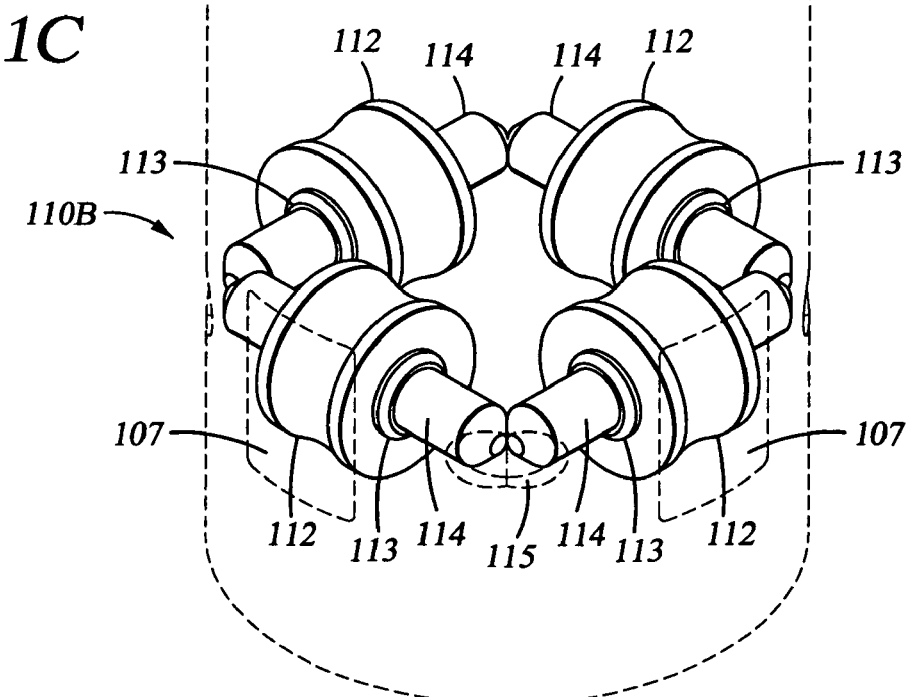

US 8,216,422 B2

SUBSTRATE SUPPORT BUSHING

CROSS-REFERENCE TO RELATED APPLICATIONS

This application is a continuation of co-pending U.S. patent application Ser. No. 10/779,130, filed Feb. 12, 2004.

BACKGROUND OF THE INVENTION

1. Field of the Invention

Embodiments of the present invention generally relate to a substrate support pin. More particularly, embodiments of the present invention relate to a support pin for large glass panels.

2. Description of the Related Art

Thin film transistors have been made on large glass substrates or plates for use in monitors, flat panel displays, solar cells, personal digital assistants (PDA), cell phones, and the like. These transistors are made by sequential deposition of various films including amorphous silicon, both doped and undoped silicon oxides, silicon nitride, and the like in vacuum chambers. The film deposition takes place in a single deposition chamber or system, or the substrate being processed is transferred among multiple deposition chambers. Within each deposition chamber, the substrate being processed typically rests on a support pedestal situated within the chamber. To facilitate transfer of the substrate between the deposition processes, support members, such as a plurality of pins for example, are mounted on an upper surface of the support member so that the substrate is spaced apart from the support pedestal. This allows a transfer mechanism such as a robot blade to slide underneath a back side of the substrate and lift the substrate off the support pedestal without causing damage to either the support pedestal or the substrate.

The support pins are most often vertical posts having a fixed height that are secured to an upper surface of the support pedestal. The support pins are usually rigid, providing no forgiveness for friction against the glass substrate disposed thereon. This friction most often results in unwanted particle contamination. Additionally, the support pins have a tendency to chip, bend, or break due to the repetitive loading and unloading of the substrates. These events occur due to misalignment of the substrate as the substrate enters and leaves the processing chamber. Damage to the pins may also occur due to operator error and most often, the damage is due to normal wear and tear. Accordingly, the support pins are usually replaced after extended periods of use, causing down time for removing the damaged pins and installing the replacements.

There is a need, therefore, for a support pin capable of reducing friction with a substrate disposed thereon, which increases the longevity of the support pin and reduces the amount of down time.

SUMMARY OF THE INVENTION

The present invention generally provides a substrate support member for supporting a substrate within a processing chamber. In one aspect, the substrate support member comprises a housing having a bore formed therethrough, a support pin at least partially disposed within the bore, and a plurality of bearing elements disposed about the housing.

In another aspect, the substrate support member comprises a housing having a bore formed therethrough, and a plurality of bearing elements disposed within the bore wherein at least one of the bearing elements comprises a roller having a central bore formed therethrough and a contoured outer surface, and a shaft at least partially disposed through the central bore.

In yet another aspect, the substrate support member comprises a housing having a bore formed therethrough, and a plurality of bearing elements disposed within the bore wherein at least one of the bearing elements comprises a ball assembly comprising a larger spherical member and four smaller spherical members arranged about the larger spherical member.

The present invention also provides a processing chamber having a substrate support assembly disposed therein. In one aspect, the chamber includes a chamber body having a support pedestal disposed therein, and two or more support members each disposed on an upper surface of the support pedestal. The support members comprise a housing having a bore formed therethrough, a support pin at least partially disposed within the bore, and a plurality of bearing elements disposed within the bore. In another aspect, the chamber includes a lift assembly disposed within the chamber body, adjacent the support pedestal. The lift assembly is adapted to load and unload substrates to and from the support pedestal.

In one aspect, the bearing elements comprise a roller having a central bore formed therethrough, a contoured outer surface, and a shaft at least partially disposed through the central bore. In another aspect, the bearing elements comprise a ball assembly comprising a larger spherical member and four smaller spherical members arranged about the larger spherical member.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1C is a schematic view of one embodiment of a bearing element shown in FIG. 1A.

DETAILED DESCRIPTION OF THE PREFERRED EMBODIMENT

Figure 1A:
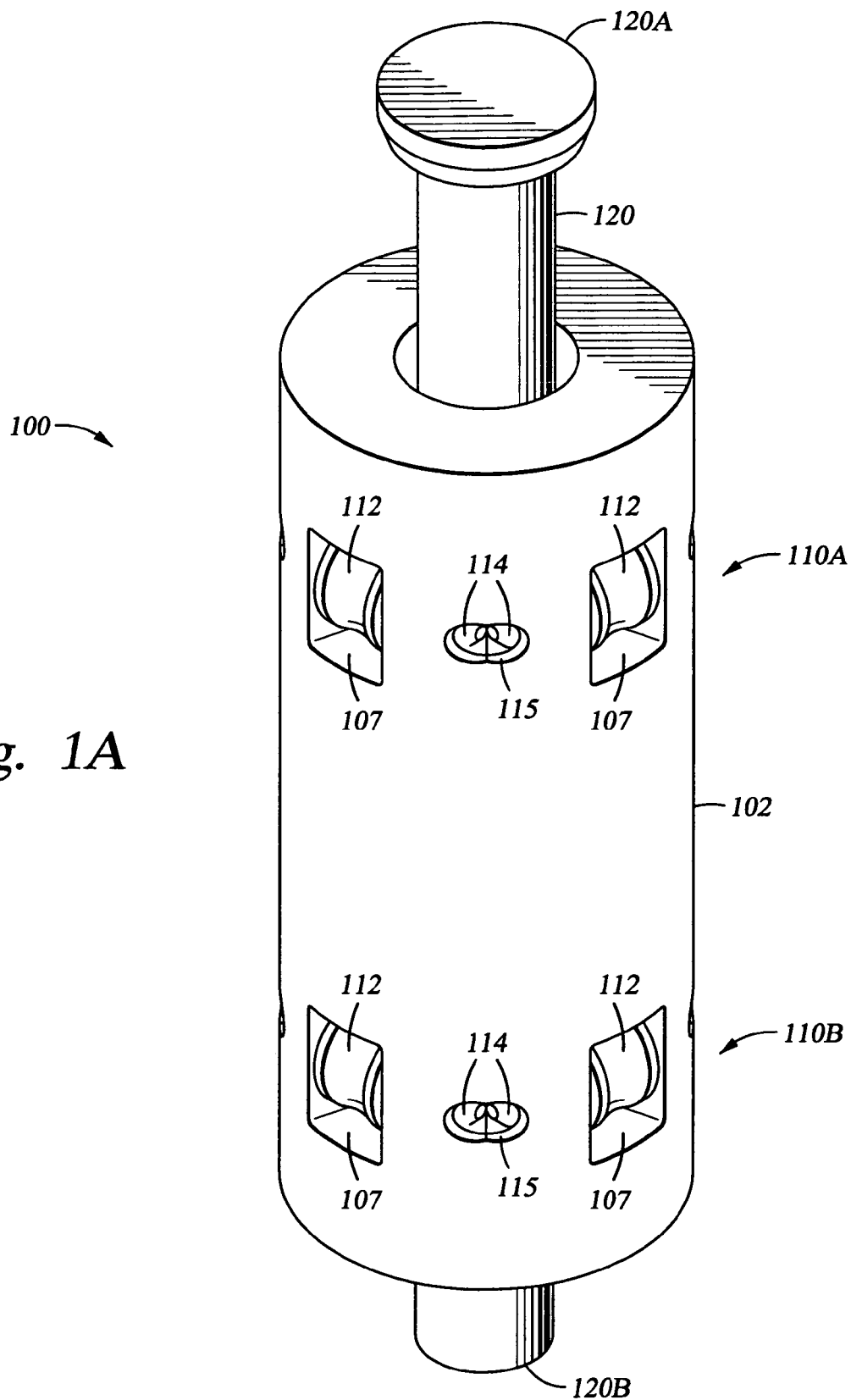
FIG. 1A is a schematic view of one embodiment of a support member described herein.

FIG. 1A shows a schematic view of one embodiment of a support member 100. As shown, the support member 100 includes a housing, such as a bushing 102 having one or more bearing elements 110A, 110B (two are shown) and a support pin 120 at least partially disposed therein. At a first end thereof, a substrate (not shown), such as any semiconductor substrate including a flat panel display, round wafer, liquid crystal display, glass panel substrate, plastic substrate, and the like, is supported thereon. At a second end thereof, the support member 100 is typically disposed on an upper surface of a support pedestal, susceptor, robot blade, shelf, or other member adapted to hold or support a substrate thereon (not shown).

Figure 1B:
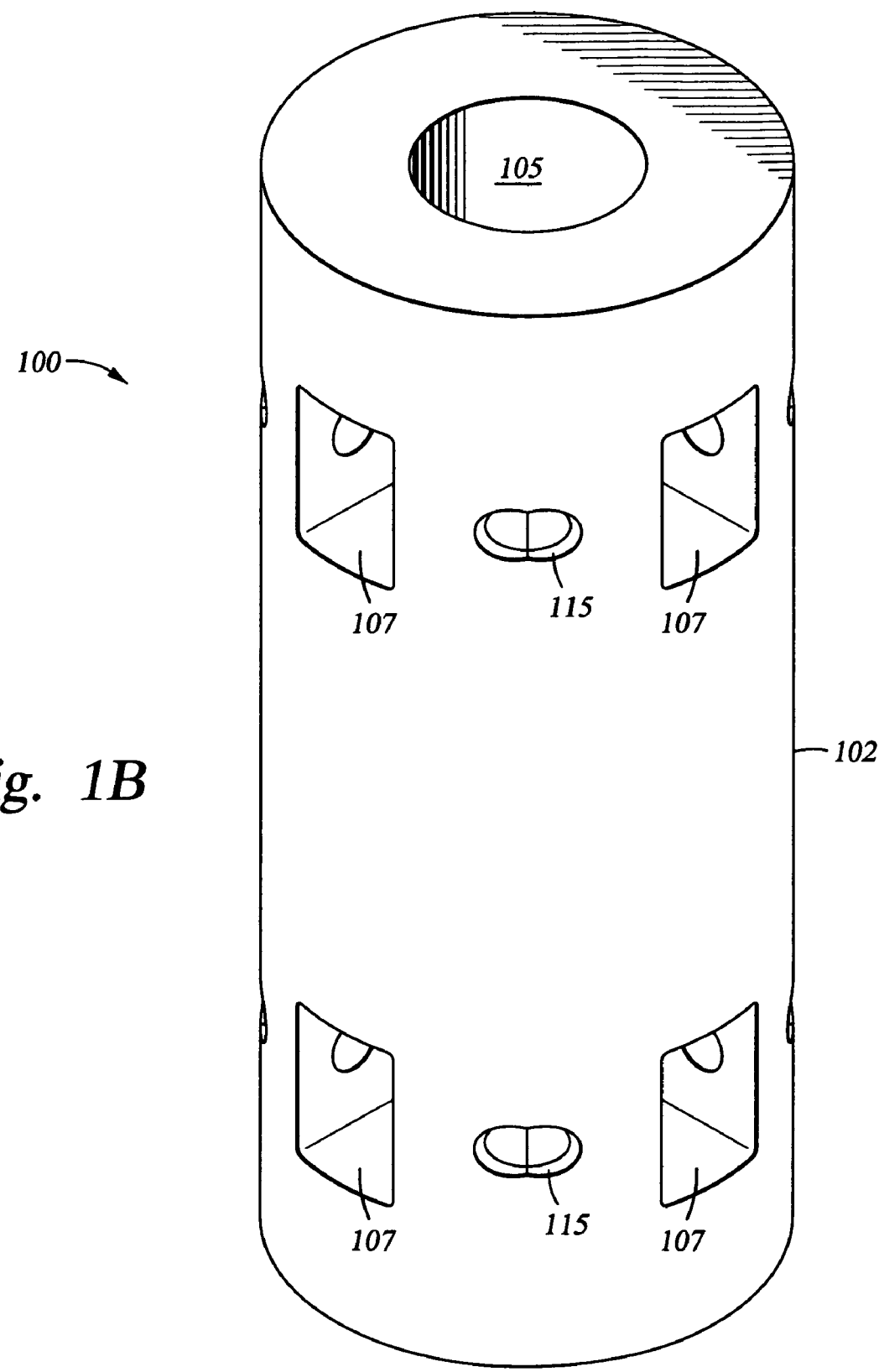
FIG. 1B is a schematic view of one embodiment of a bushing shown in FIG. 1A.

FIG. 1B shows a schematic view of the bushing 102. The bushing 102 is an annular member having a central bore 105 and one or more windows 107 formed therethrough. Preferably, the bushing 102 resembles a cylindrical tube. In one aspect, the bushing 102 includes a first set of windows 107 located at a first end thereof and a second set of windows 107 located at a second end thereof. The actual number of windows 107 is a matter of design; however, it is preferable to have a set of four or more windows 107 located at the first end of the bushing 102 and a second set of four or more windows 107 located at the second end of the bushing 102. Additional sets of windows 107 may be desired based on the intended use and processing environment of the support member 100.

Figure 1D:
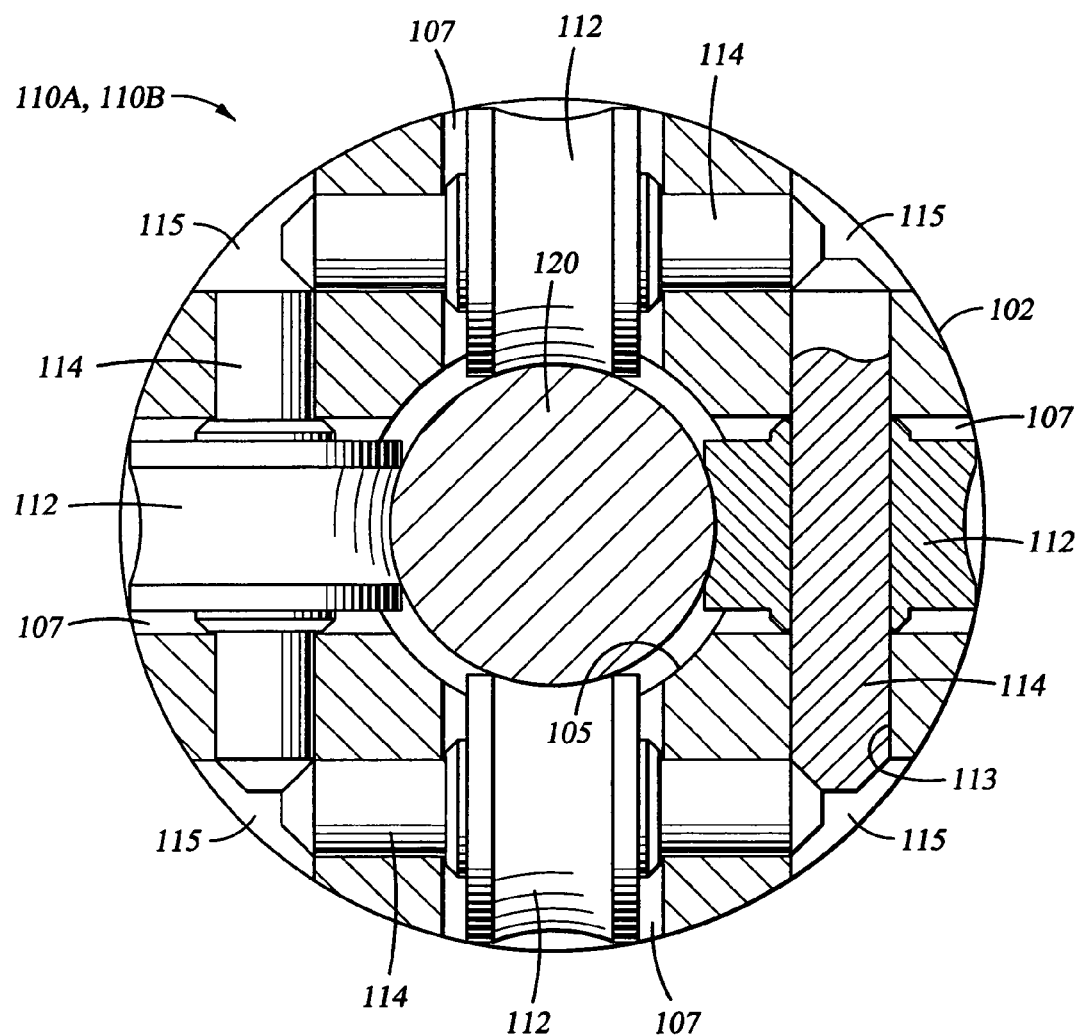
FIG. 1D is a partial cross section view of the bearing elements shown in FIG. 1C.

FIG. 1C shows a schematic view of the bearing elements 110A, 110B shown in FIG. 1A. FIG. 1D shows a partial cross section view of the bearing elements 110A, 110B. Referring to FIGS. 1C and 1D, the first bearing element 110A is housed within the first set of windows 107 at least partially formed through the first end of the bushing 102. The second bearing element 110B is housed within the second set of windows 107 at least partially formed through the second end of the bushing 102. In one aspect, each bearing element 110A, 110B includes one or more rollers 112 having a central bore 113 formed therethrough and a shaft 114 disposed at least partially through the central bore 113. The shaft 114 is secured to the bushing 102 to hold the roller 112 in place. In one aspect, the ends of each shaft 114 are chamfered to form a conical shape as shown in FIG. 1C. Upon installation of the bearing elements 110A, 110B, within the bushing 102, the rollers 112 are held into place via a friction fit facilitated by the ends of the shafts 114 arranged opposite one another. Cut outs 115 are helpful for manipulating the shafts 114 within the bushing 102.

The bearing elements 110A, 110B support the pin 120 within the bushing 102. The bearing elements 110A, 110B also allow the support pin 120 to move axially through the bore 105 of the bushing 102 and rotate within the bore 105 with minimal resistance. Consequently, the bearing elements 110A, 110B reduce wear and tear on the support pin 120 and reduce unwanted particle generation caused by friction.

Referring again to FIGS. 1A and 1D, each roller 112 preferably has an outer surface that is curved or concave to compliment the contour of the outer surface of the support pin 120, which is typically cylindrical in shape. The curved outer surface of the roller 112 provides a guide to facilitate movement of the pin 120 in an axial direction relative to the bushing 102. The curved outer surface of the roller 112 also allows the pin 120 to rotate freely within the bushing 102. The roller 112 may be constructed of any process compatible material, such as ceramics, graphite, stainless steel, aluminum, alloys thereof, and combinations thereof, for example.

Figure 2A:
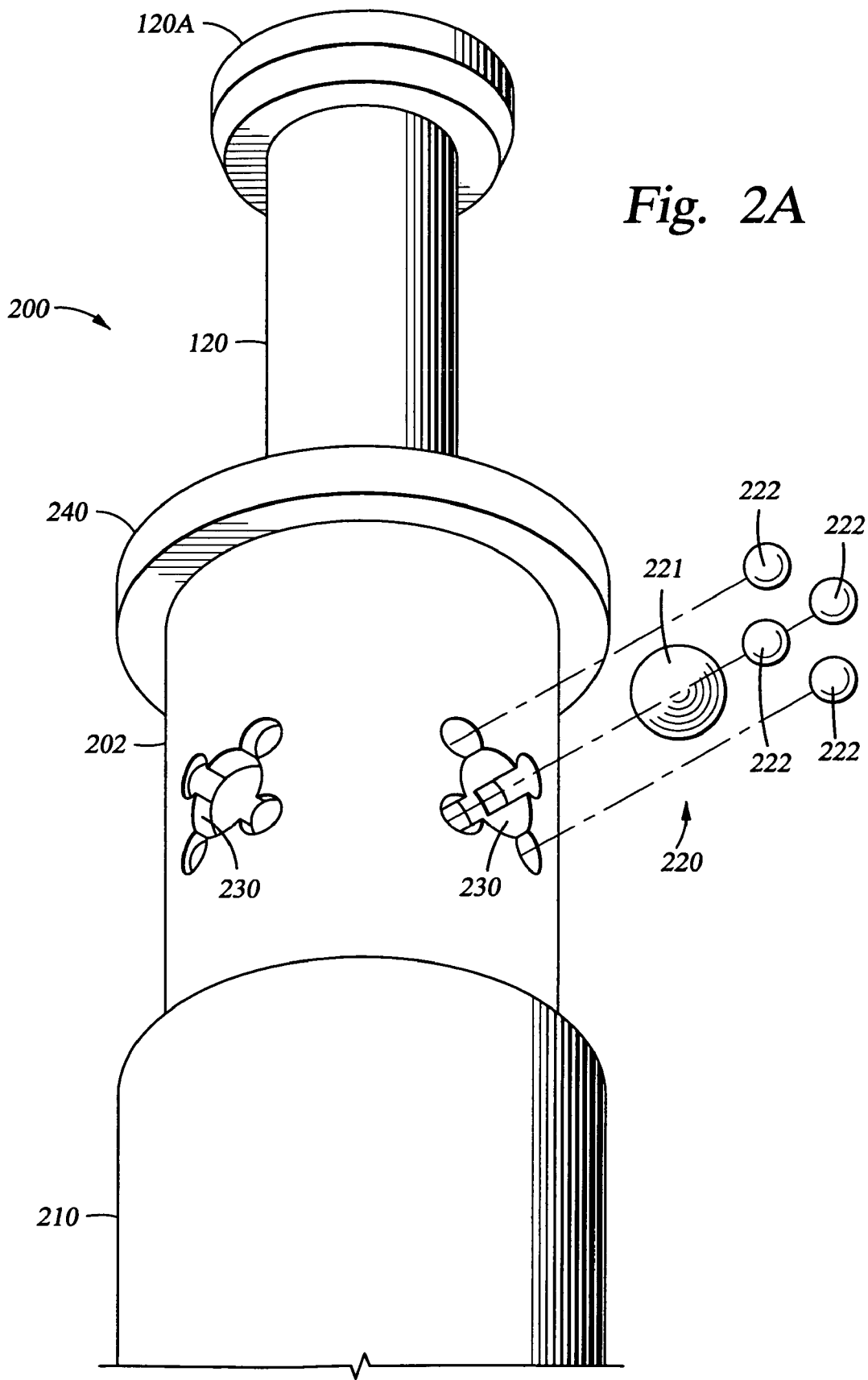
FIG. 2A is a schematic view of another embodiment of a support member described herein.
Figure 2B:
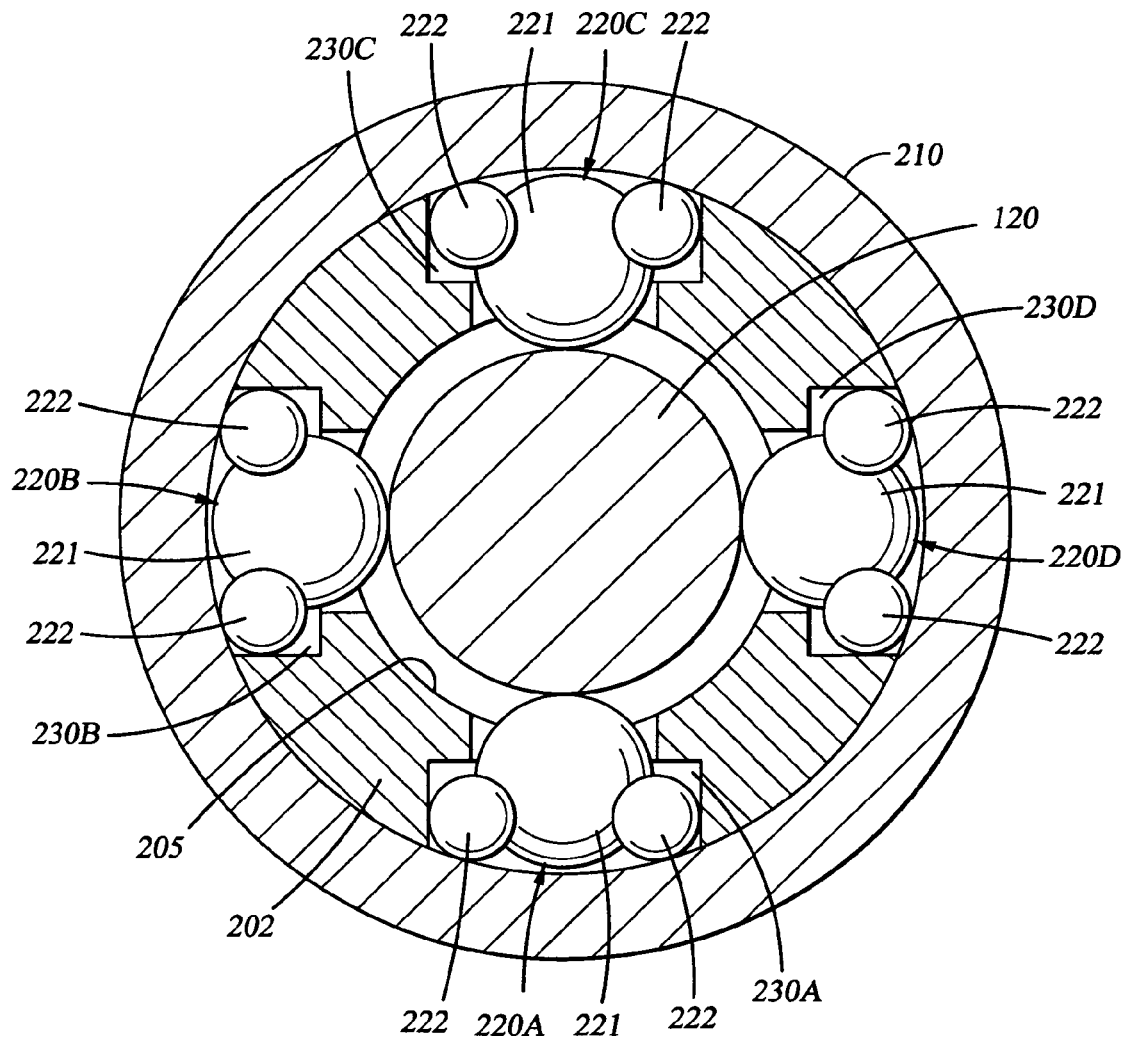
FIG. 2B is a top view of the support member shown in FIG. 2A.
Figure 2C:
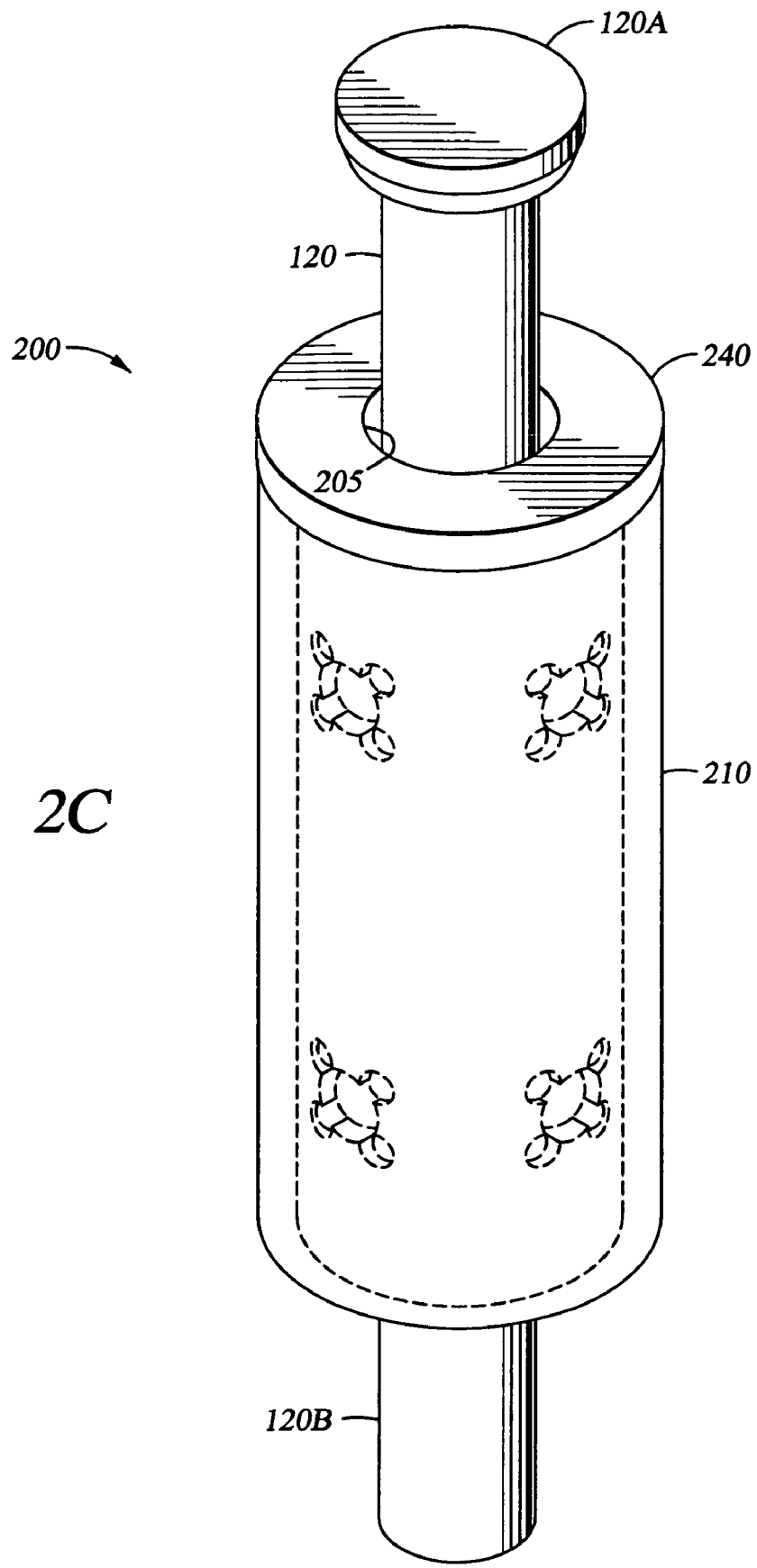
FIG. 2C is another schematic view of a fully assembled support member shown in FIG. 2A.

FIGS. 2A-C show a schematic view of another embodiment of a support member 200. In this embodiment, the support member 200 includes a sleeve 210 and a bushing 202 having one or more bearing elements 220 at least partially disposed therein. The support member 200 also includes a flange 240 disposed about an upper end of the bushing 202.

Referring to FIG. 2A, each of the one or more bearing elements 220 includes at least one spherical member 221. In one aspect, each of the one or more bearing elements 220 further includes four additional spherical members 222 having a smaller diameter than the spherical member 221. Each bearing element 220 is disposed within a ball seat or window 230 at least partially formed in the bushing 202. The sleeve 210 is disposed about the outer diameter of the bushing 202 to encapsulate the bearing elements 220 within their respective window 230. The flange 240 serves as a shoulder or stop for the sleeve 210.

In one aspect, four windows 230 each having a bearing element 220 at least partially disposed therein are evenly spaced about a first diameter of the bushing 202 at a first end thereof and four windows 230 each having a bearing element 220 at least partially disposed therein are evenly spaced about a second diameter of the bushing 202 at a second end thereof. The cooperation of the windows 230 and the bearing elements 220 allow the support pin 120 to move axially within the bore 205 of the bushing 202 as well as to rotate about a central axis of the bushing 202.

FIG. 2B shows a top view of the support member 200 shown in FIG. 2A, and FIG. 2C shows another schematic view of a fully assembled support member 200. The bushing 202 is an annular member having a central bore 205 formed therethrough. Preferably, the bushing 202 resembles a cylindrical tube. The bearing elements 220A-D described above are each at least partially disposed within a respective window 230A-D at least partially formed in the bushing 202. The sleeve 210 is disposed about the outer diameter of the bushing 202, and the support pin 120 is at least partially disposed within the bore 205. The sleeve 210 and the support pin 120 collaborate to contain the balls 221, 222 within their respective window 230. The flange 240 may be a separate component as shown or the flange 240 may be an extended outer diameter of the bushing 202. The flange 240 prevents the sleeve 210 from traveling axially past the first end of the bushing 202.

Referring again to FIGS. 1A and 2C, the support pin 120 of the support member 100 and the support member 200 will now be described in greater detail. Preferably the support pin 120 is a cylindrical member having a first end 120A and a second end 120B as shown in FIGS. 1A and 2C.

In one aspect, the support pin 120 may have a heavier lower portion or the second end 120B may be constructed of a heavier material to lower the overall center of gravity of the support pin 120. For example, the lower portion of the pin 120 or the second end 120B may be constructed of a more dense material using materials, such as Teflon® or ceramic coated stainless steel, for example.

The first end or pin head 120A directly contacts a substrate (not shown) to support the substrate. In one aspect, the first end 120A is coated with a material that reduces friction and is chemically inert with the substrate disposed thereon. For example, the first end 120A may be coated with a chemically inert material to reduce or eliminate chemical reactions between the support pin 120 and the substrate supported thereon. Additionally or alternatively, the first end 120A may be coated with a material that minimizes friction with the substrate to reduce breakage or chipping. Exemplary coatings include but are not limited to ceramic materials and nitrides, such as silicon nitride, titanium nitride, and tantalum nitride, for example. Additionally or alternatively, the first end 120A has either a machined or polished finish or other suitable finish to produce a surface roughness of no more than 4 micro inches to minimize friction. A more detailed description of such coatings may be found in U.S. Pat. No. 6,528,767, which is incorporated by reference herein.

In one aspect, the first end 120A may have a planar or substantially planar surface, as shown. In another aspect, the first end 120A may have a rounded upper portion that contacts a substrate disposed thereon. The rounded surface reduces surface area in contact with the substrate thereby reducing the chances of breaking or chipping the substrate disposed thereon. In one embodiment, the rounded surface resembles a hemispherical, ellipsoidal, or parabolic shape. A more detailed description of such support pins and coatings may be found in U.S. Pat. No. 6,528,767, which is incorporated by reference herein.

In yet another aspect, the first end 120A may be a two piece system having a cap (not shown) disposable on the body of the pin 120. The cap is preferably made of a ceramic material, and includes a hollow body to receive the body of the pin 120. The upper portion of the cap may be rounded and smoothed as discussed above. Similarly, the cap may be coated as described above. A more detailed description of such a two piece system may also be found in U.S. Pat. No. 6,528,767, which is incorporated by reference herein.

In yet another aspect, the first end 120A may be a socket that retains a ball moveable within the socket. The ball makes contact with and supports the substrate disposed thereon. The ball is allowed to rotate and spin, much like a ball bearing, within the socket allowing the substrate to move across the ball without scratching. The ball is generally constructed of either metallic or non-metallic materials that provide friction reduction and/or inhibit chemical reaction between the ball and the substrate. For example, the ball may include a metal or metal alloy, quartz, sapphire, silicon nitride or other suitable non-metallic materials. Preferably, the ball has a surface finish of 4 micro-inches or smoother. The ball may further include the coating or coatings described above. A more detailed description of such a support pin may be found in U.S. Pat. No. 6,528,767, which is incorporated by reference herein.

In yet another aspect, the first end 120A may be a two piece system having a cap disposable on the body of the pin 120, whereby the cap includes the socket and ball configuration described above. A more detailed description of such a ball and socket may be found in co-pending U.S. patent application Ser. No. 09/982,406, as well as Ser. No. 10/376,857, both entitled "Substrate Support", and both assigned to Applied Materials, Inc. Both co-pending applications are incorporated by reference herein.

The support members 100, 200 described herein are suitable for use in any testing chamber, processing chamber, or system that requires support of a substrate. For example, the support members 100, 200 are particularly useful within a deposition chamber, such as a chemical vapor deposition (CVD) chamber or plasma enhanced chemical vapor deposition (PECVD) chamber. For clarity and ease of description, a PECVD chamber utilizing the support members 100, 200 described herein is described below with reference to FIGS. 3 and 3A-3C.

Figure 3:
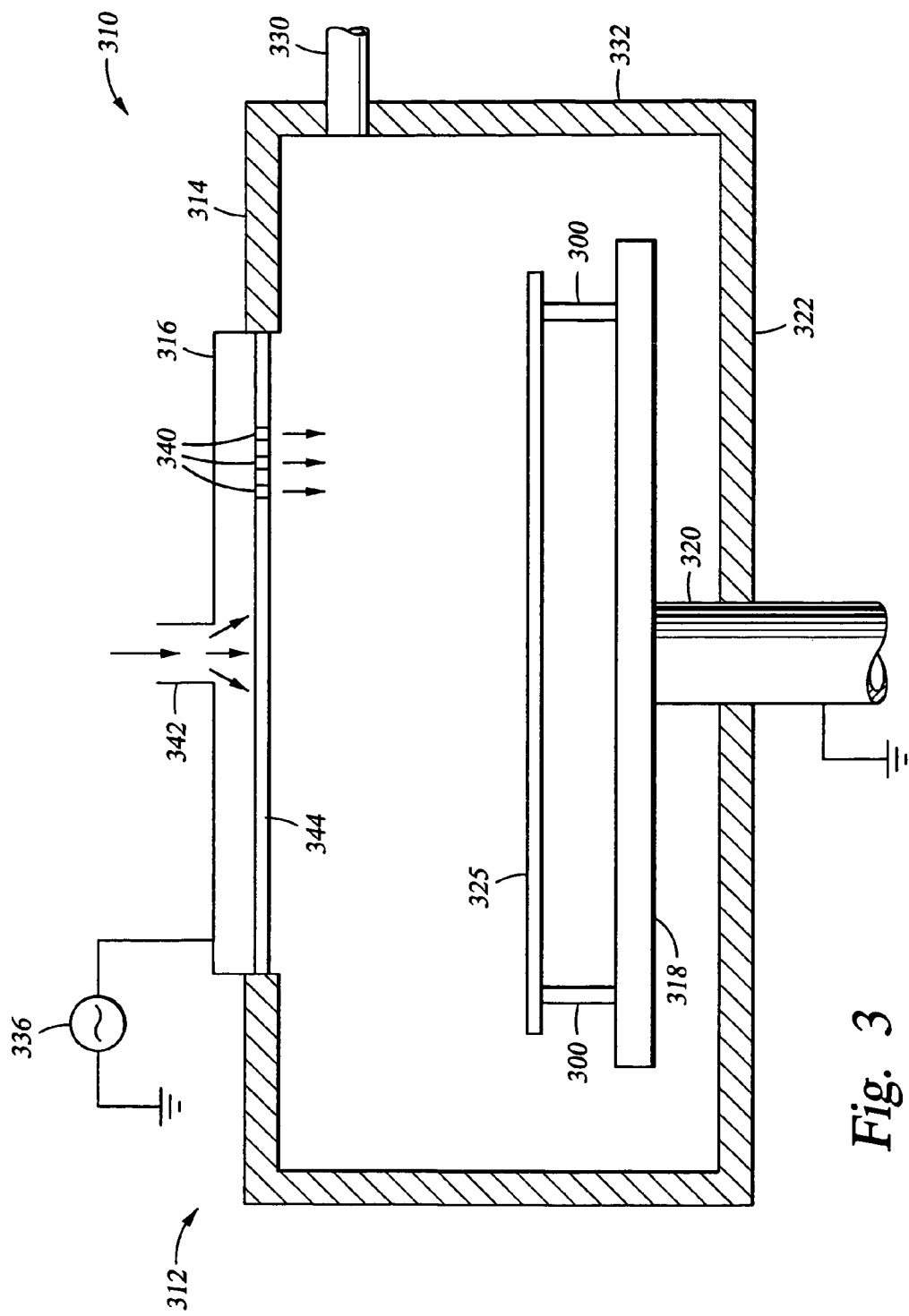
FIG. 3 is a schematic sectional view of an exemplary plasma-enhanced chemical vapor deposition chamber utilizing the support members as shown in FIGS. 1A-D and FIGS. 2A-C, either alone or in combination.

FIG. 3 shows a schematic sectional view of a plasma-enhanced chemical vapor deposition chamber 310. The PECVD chamber includes a chamber body 312 having an opening formed through a top wall 314 and a gas inlet manifold 316 disposed within the opening. Alternatively, the top wall 314 can be solid and the gas inlet manifold 316 is located adjacent an inner surface thereof. The gas inlet manifold 316 serves as an electrode and is connected to a power source 336, such as a RF power source.

A susceptor or support pedestal 318 is disposed within the chamber body 312. The support pedestal 318 resembles the form of a plate and extends parallel to the gas inlet manifold 316. The support pedestal 318 is typically made of aluminum and coated with a layer of aluminum oxide. The support pedestal 318 is connected to ground and serves as a second electrode so as to connect the power source 336 across the gas inlet manifold 316 and the support pedestal 318.

The susceptor or support pedestal 318 is mounted on the end of a shaft 320 which extends vertically through a bottom wall 322 of the chamber body 312. The shaft 320 is movable so as to permit the movement of the support pedestal 318 vertically up and down within the chamber body 312. Two or more support members 300, described above as support members 100 and 200, are disposed on an upper surface of the support pedestal 318 to directly contact and support a substrate 325 therein. While there are only two support members 300 shown, any number of support members 300 may be arranged about the upper surface of the support pedestal 318. The number and arrangement of the support members 300 depend on the shape and size of the substrate 325 to be processed as well as the process performed with the chamber 310. In one aspect, each support members 300 is identical, such as either the embodiment 100 described above or the embodiment 200 described above. In another aspect, the support members 300 may be a combination of the embodiments 100 and 200 described above. For example, one or more of the support members 300 may be the embodiment 100 described above and one or more of the support members 300 may be the embodiment 200 described above.

Still referring to FIG. 3, the chamber 310 further includes a gas outlet 330 extending through a side wall 332 of the chamber body 312. The gas outlet 330 is connected to a pump (not shown) for evacuating gases from the chamber body 312. A gas inlet conduit 342 is in fluid communication with the gas inlet manifold 316, and is connected through a gas switching network (not shown) to sources (not shown) of various gases. Process gases flow via the inlet conduit 342 through a showerhead 344, and into the chamber body 312. The showerhead 344 includes a plurality of apertures 340 formed therethrough to evenly distribute the gases across the surface of the substrate 325 to be processed below.

Figure 3A:
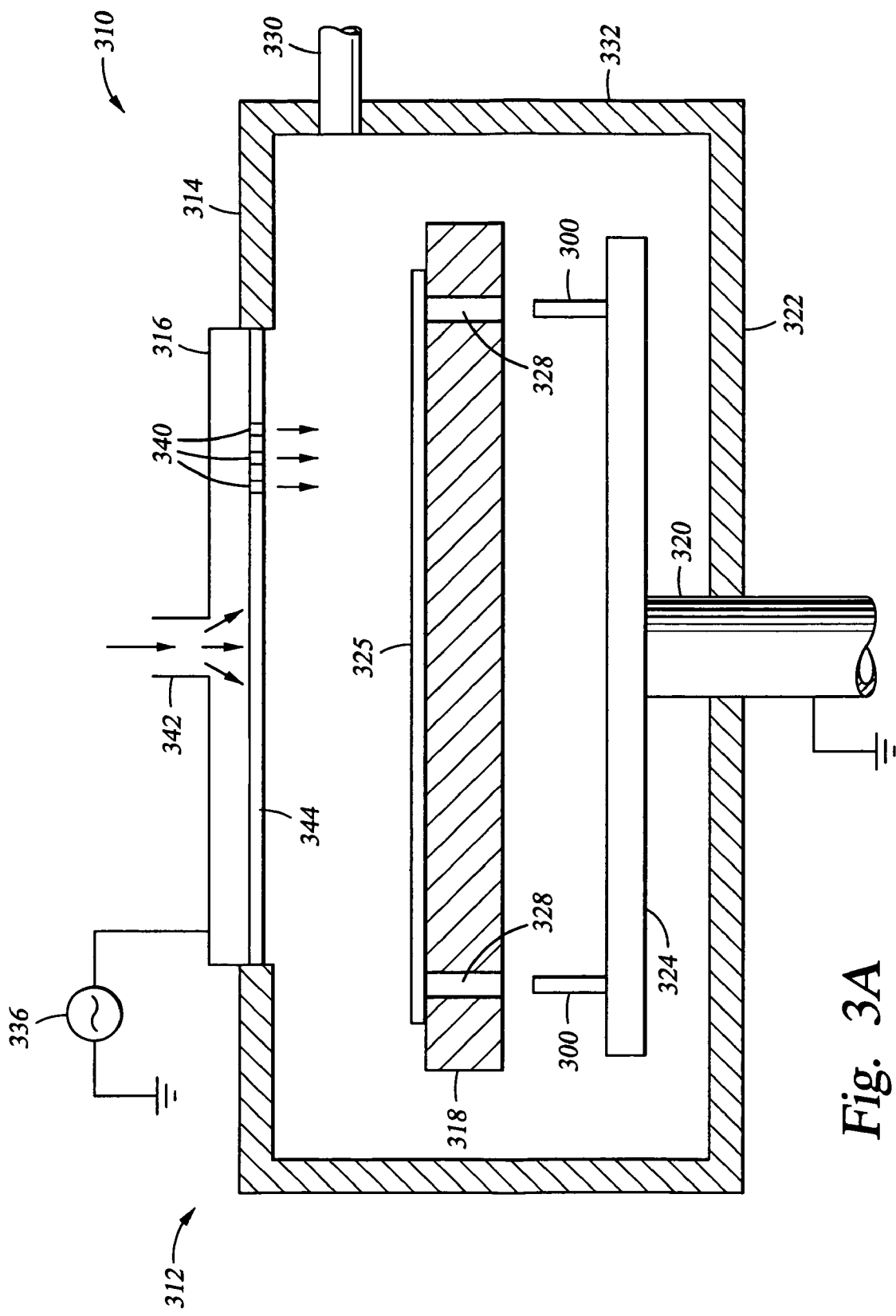
FIG. 3A is a schematic sectional view of a particular embodiment of the plasma-enhanced chemical vapor deposition chamber shown in FIG. 3. In this embodiment, the chamber includes a lift-off plate to facilitate the transfer of a substrate on and off a susceptor.

FIG. 3A shows a schematic sectional view of a particular embodiment of the plasma-enhanced chemical vapor deposition chamber 310 having a lift assembly 324 to facilitate the transfer of a substrate 325 on and off the support pedestal 318. The lift assembly 324 extends horizontally between the support pedestal 318 and the bottom wall 322 of the chamber body 312. The lift assembly 324 is substantially parallel to the support pedestal 318 and is vertically movable. In one embodiment, two or more support members 300 are disposed on an upper surface of the lift assembly 324 instead of the upper surface of the support pedestal 318. In another embodiment (not shown), both the susceptor 318 and the lift assembly 324 may have two or more support members 300 disposed on an upper surface thereof.

The support members 300 are positioned to extend through lift holes 328 formed through the susceptor 318. While there are only two support members 300 shown, any number of support members 100 (or 200) may be arranged about the upper surface of the lift assembly 324. The number and arrangement of the support members 300 will depend on the size of the substrate 325 to be processed as well as the process performed with the chamber 310. As stated above, each support member 300 is identical, such as either the embodiment 100 or the embodiment 200 described herein, or alternatively, the support members 300 may be a combination of the embodiments 100 and 200.

Figure 3B:
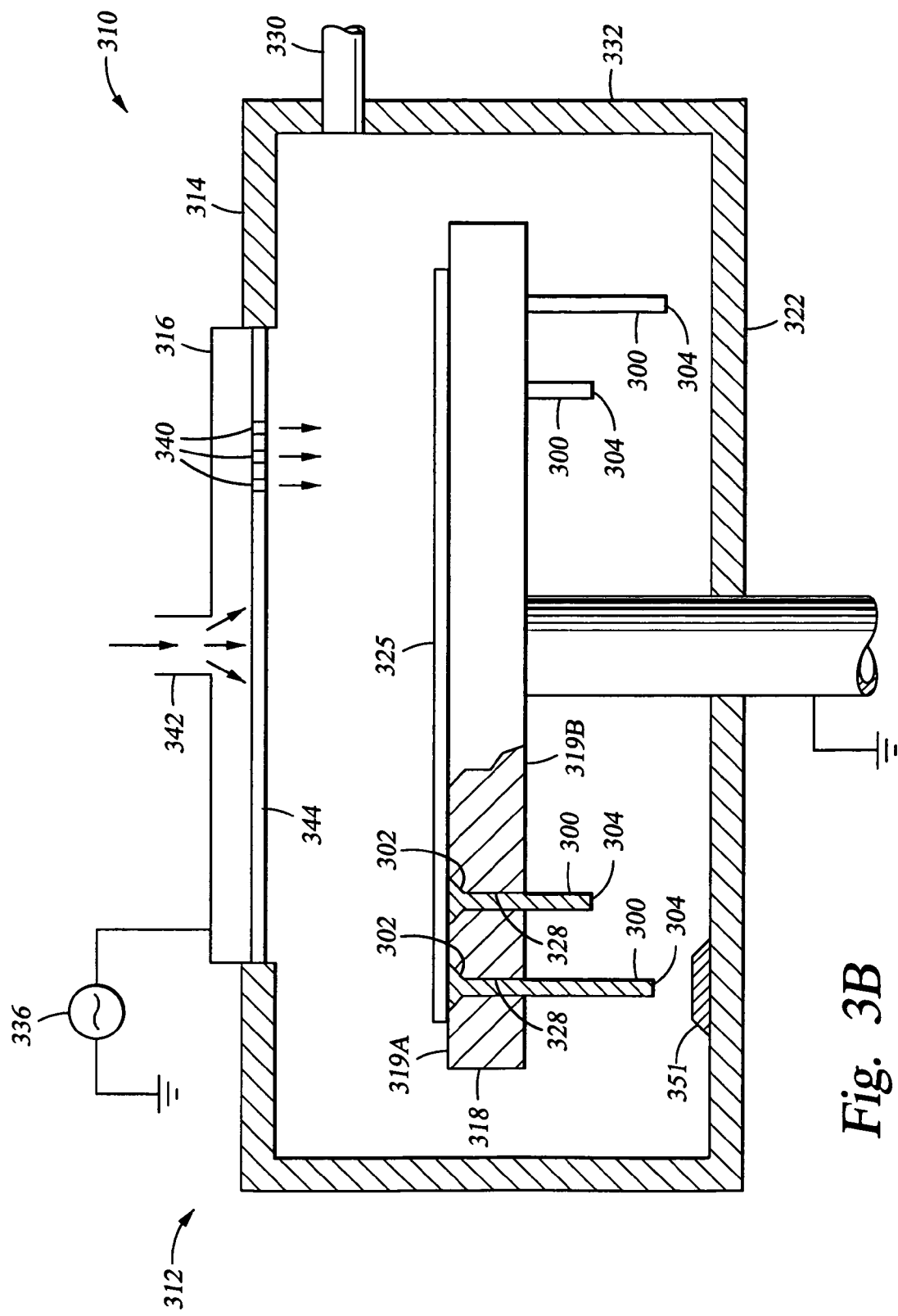
FIG. 3B is a schematic sectional view of another particular embodiment of the plasma-enhanced chemical vapor deposition chamber shown in FIG. 3. In this embodiment, the support members shown in FIGS. 1A-1C and 2A-2D are disposed at least partially within a support assembly disposed with the chamber.

FIG. 3B shows another embodiment of a PECVD chamber 310 having the support members 300 disposed at least partially within the support assembly 318. In this embodiment, the support pedestal 318 includes a plurality of holes 328 disposed therethrough. The support members 300 are disposed at least partially within these holes 328. Generally, a flared first end 302 of the support member 300 is substantially flush with or slightly recessed from an upper side 319A of the support pedestal 318 when the support members 300 are in a normal position (i.e., retracted relative to the support pedestal 318). Additionally, a second end 304 of the support members 300 extends beyond a lower side 319B of the support pedestal 318. As the support pedestal 318 is lowered to a transfer position, the support members 300 come in contact with the bottom surface 322 of the chamber 312 and are displaced through the support pedestal 318 to project from the upper side 319A of the support assembly 318, thereby placing the substrate 325 in a spaced-apart relation to the support pedestal 318.

In one aspect of this embodiment, the support members 300 may have varying lengths as shown so that the support members 300 contact with the bottom 322 and are actuated at different times. For example, longer support members 300 may be spaced around the outer edges of the substrate 325, and shorter support members 300 may be spaced inwardly from the outer edges toward the center of the substrate 325, allowing the substrate 325 to be gradually lifted from its outer edges to its center.

In another aspect of this embodiment, the support members 300 may all be of uniform length, but the bottom 322 of the chamber 312 may include extensions or plateaus 351 positioned beneath selected support members 300 so that these selected support members 300 are actuated before the others. Alternatively, the chamber bottom 322 may comprise grooves or trenches (not, shown) aligned beneath selected support members 300, so that these support members 300 are actuated after the others.

Figure 3C:
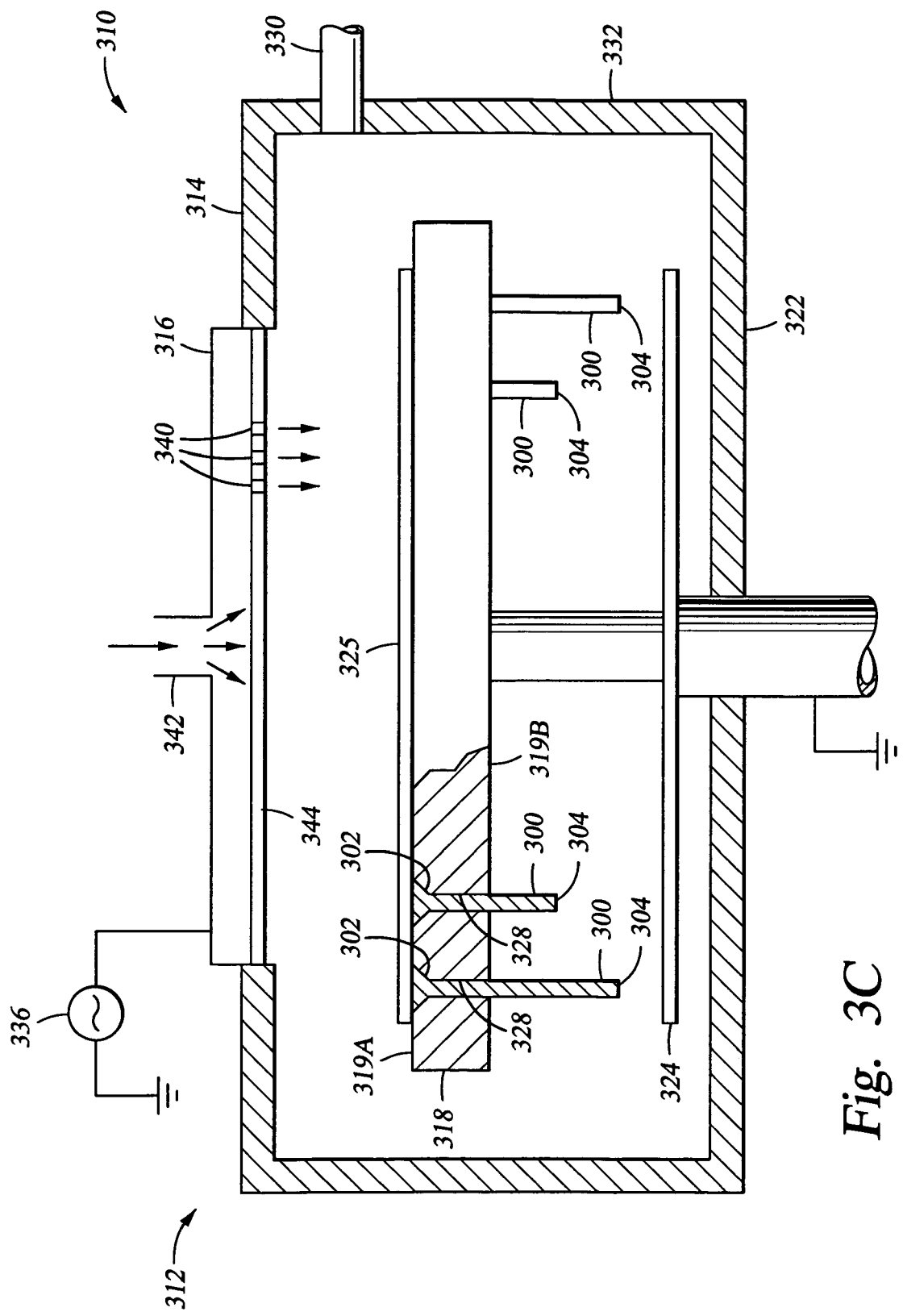
FIG. 3C is a schematic sectional view of yet another particular embodiment of the plasma-enhanced chemical vapor deposition chamber shown in FIG. 3. In this embodiment, the support members shown in FIGS. 1A-1C and 2A-2D are disposed at least partially within the support assembly as shown in FIG. 3B. The chamber also includes a lift plate to activate the support members.

FIG. 3C shows yet another embodiment of a PECVD chamber 310 having the support members 300 disposed at least partially within the support pedestal 318 as shown in FIG. 3B, and also includes a lift plate 324 to activate the support members 300. In this embodiment, the lift plate 324 is disposed proximate the underside 319B of the support pedestal 318, and below the second ends 304 of the support members 300. The lift plate 324 is coupled to an actuator such as a pneumatic cylinder, hydraulic cylinder, lead screw, solenoid, stepper motor or other motion device (not shown) that is typically positioned outside of the chamber body 312. The vertical motions of the lift plate 324 and the support pedestal 318 may be controlled via a single actuator utilizing a spring and a motion stop that controls the relative motion between the lift plate 324 and the support pedestal 318. In operation, the lift plate 324 moves upward, contacting the second ends 304 of the support members 300, which extends the support members 300 beyond the upper surface of the support pedestal 318.

As described above, the support members 300 may each have different lengths to actuate the support members 300 at different times. Typically, the support members 300 disposed about the perimeter of the support pedestal 318 are longer than the support members 300 disposed about the center of the support assembly 318. A reverse arrangement may also be useful.

Testing chambers and processing chambers utilizing the support members 100, 200 described herein, such as the processing chamber 310 described above, may be integrated into a processing platform, such as an AKT 15K, 25K, or 40K PECVD System available from AKT, Inc., located in Santa Clara, Calif. Details of these PECVD Systems are described in commonly assigned U.S. Pat. No. 5,512,320, entitled "Vacuum Processing Apparatus Having Improved Throughput", which is incorporated by reference herein.

Figure 4:
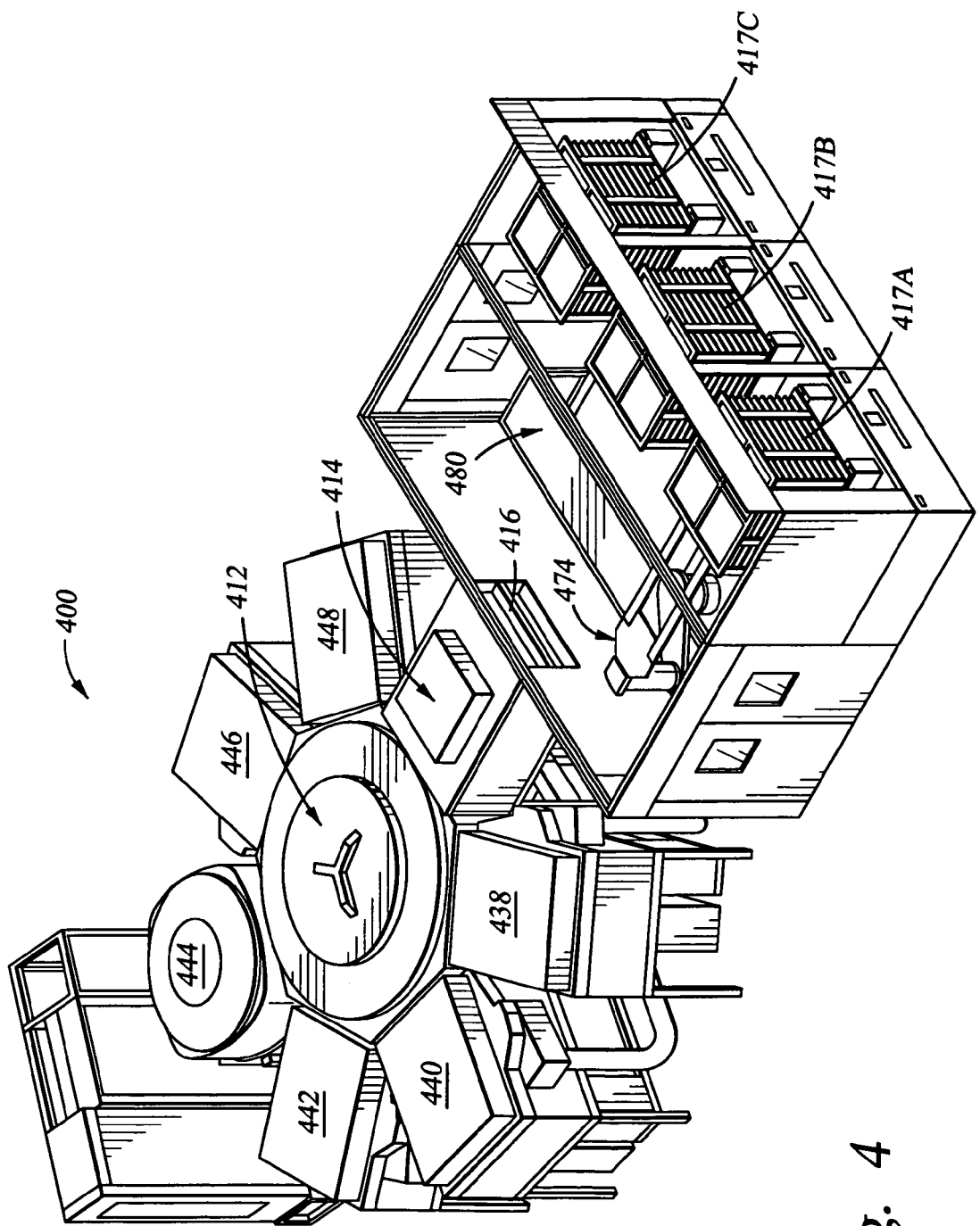
FIG. 4 is a schematic top-view of an exemplary multi-chamber processing system.

FIG. 4 shows a schematic top-view diagram of an exemplary multi-chamber processing system 400. The processing system 400 includes a central transfer chamber 412 to which are connected a load lock chamber 414 for transferring glass substrates into and out of the system 400. The processing system 400 also includes one or more processing chambers 438, 440, 442, 444, 446, 448 each disposed about the central transfer chamber 412. Any one or more of the processing chambers 438, 440, 442, 444, 446, 448 may be a chemical vapor deposition (CVD) chamber, a physical vapor deposition (PVD) chamber, an atomic layer deposition chamber (ALD), an annealing or heat treatment chamber, or any other processing chamber known in the art. Exemplary CVD chambers making use of the support members 100, 200, 300 described herein are shown and described above. The other processing chambers may have similar uses of the support members 100, 200, 300, and thus, will not be discussed in detail.

The load lock chamber 414 includes a closable opening, such as a slit valve 416 disposed within a side wall thereof for transfer of the substrates into the vacuum environment of the processing system 400 from the atmosphere. Further, the load lock chamber 414 contains a cassette (not shown) fitted with a plurality of shelves or platforms for supporting and cooling multiple substrates therein, such as shown in FIG. 5.

Figure 5:
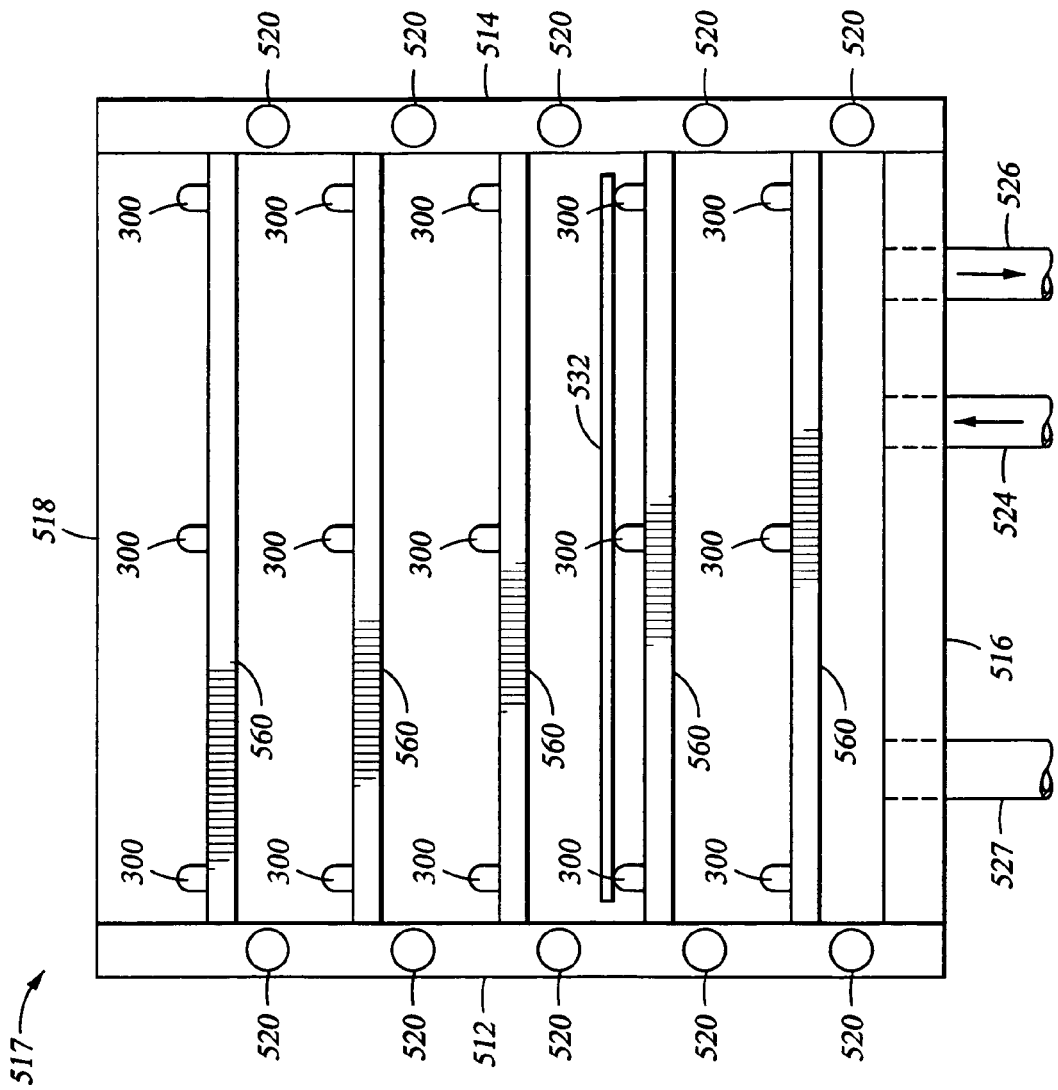
FIG. 5 is a cross section view of a batch-type heating or cooling cassette utilizing the support members, either alone or in-combination, as shown in FIGS. 1A-D and FIGS. 2A-C.

FIG. 5 shows a cross sectional view of a particular batch-type storage cassette 517. The cassette 517 includes side walls 512, 514, a bottom wall 516 and a lid 518. A plurality of channels 520 is disposed throughout the side walls 512, 514. In one aspect, the channels 520 may be in fluid communication with inlet and outlet conduits 524 and 526 for circulating a temperature controlled fluid therethough. In another aspect, the channels 520 may contain heating coils connected to a power source (not shown) via a conduit 527. Alternatively, the same conduits 524, 526 can be used for both enclosing the heating coils and for circulating the heat transfer medium in the channels 520.

The interior of the side walls 512, 514 are fitted with a plurality of heat conductive shelves 560. The shelves 560 are in good thermal contact with the walls 512, 514 to insure rapid and uniform control of the temperature of the shelves 560. Examples of materials that may be used for the shelves 560 include, but are not limited to, aluminum, copper, stainless steel, clad copper, and the like.

One or more supports 300, as described above with reference to FIGS. 1A-D and FIGS. 2A-C, are suitably arranged on each shelf 560 to support a glass substrate 532 thereon. The supports 300 maintain the glass substrates 532 to be processed so that there is a gap between the shelves 560 and the glass substrates 532. This gap insures that direct contact between the shelf 560 and the glass substrate 532 is avoided which might stress and crack the glass substrates 532 or result in contaminants being transferred from the shelf 560 to the glass substrate 532. The glass substrates 532 are heated indirectly by radiation and gas conduction rather than by direct contact of the glass substrate 532 and the shelves 560. Further, the interleaving of the glass substrates 532 and the shelves 560 provides heating to transfer the glass substrates 532 from both above and below, providing more rapid and more uniform heating of the glass substrates 532.

Referring again to FIG. 4, the glass substrates can be loaded into the processing system 400 manually or in an automated fashion. As shown in FIG. 4, a commercially available robot 474 mounted on a rail frame 480 outside the processing system 400 at a first station opposite the load lock chamber 414 can retrieve a glass substrate from a storage cassette 417A, B or C, and load the glass substrates one at a time into the processing system 400 via the load lock chamber 414. Likewise, the robot 474 can retrieve processed substrates from the load lock chamber 414 and return the substrates to one of the storage cassettes 417A, B or C. Similarly, a robot (not shown in this view) disposed within the transfer chamber 412 moves and positions the glass substrates within the processing system 400.

While the foregoing is directed to embodiments of the present invention, other and further embodiments of the invention may be devised without departing from the basic scope thereof, and the scope thereof is determined by the claims that follow.

The invention claimed is:

1. A method for processing a substrate, comprising:
moving two or more support pins within respective roller bushings supported by a support pedestal in a process chamber;
contacting a substrate to be processed in the processing chamber with a first end of the two or more support pins;
raising the support pedestal to engage the substrate on an upper surface of the support pedestal while the substrate is supported on the support pins;
raising the support pedestal to a processing position wherein a second end of the support pins are disengaged from a bottom surface of the processing chamber;
processing the substrate;
lowering the support pedestal to engage the second end of the support pins with the bottom surface; and
contacting the substrate with the first end of the support pins to lift the substrate away from the upper surface of the support pedestal, wherein each of the roller bushings comprise a housing having a bore formed therethrough supporting a plurality of roller elements, wherein at least a portion of the plurality of roller elements axially support the support pin that is at least partially disposed within the bore, and four windows formed therethrough at a first end thereof and four windows formed therethrough at a second end thereof, each window having one of the roller elements at least partially disposed therein.

2. The method of claim 1, wherein each of the roller elements further comprise:
a plurality of rollers having a central bore formed therethrough, and a shaft at least partially disposed through the central bore.

3. The method of claim 1, wherein each roller bushing further includes one or more cut-outs formed between an outer diameter of the housing and at least one of the plurality of windows.

4. The method of claim 1, wherein the first end of the two or more support pins includes a flared end.

5. A method for processing a substrate, comprising:
moving two or more support pins within respective roller bushings supported by a support pedestal in a process chamber, each of the roller bushings comprising a housing having a longitudinal bore, a plurality of windows formed in a radial direction between the bore and an outer diameter of the housing, and one or more cut-outs formed between the outer diameter of the housing and at least one of the plurality of windows;
contacting a substrate to be processed in the process chamber with a first end of the two or more support pins;
moving the support pedestal towards the substrate supported on the support pins to receive the substrate;
processing the substrate;
moving the support pedestal to a lowered position; and
moving the two or more support pins to contact the substrate and lift the substrate from the support pedestal wherein each of the two or more support pins include a second end and are moved by the second end contacting a lower portion of the process chamber.

6. The method of claim 5, wherein the first end of the two or more support pins includes a flared end.

7. A method of positioning a substrate, comprising:
lowering a support pedestal disposed in a processing chamber to a position such that a plurality of support pins suspended in openings in the support pedestal contact a bottom surface of the processing chamber;
further lowering the support pedestal while each of the plurality of support pins are guided along one or more of a plurality of rolling surfaces;
extending a robot having a substrate thereon into the processing chamber to a position above the support pins;
lowering the robot until the substrate rests on the support pins;
retracting the robot from the processing chamber; and
raising the support pedestal to a position in contact with the substrate, wherein each of the plurality of rolling surfaces are disposed in a housing having a longitudinal bore and a plurality of windows formed in a radial direction between the bore and an outer diameter of the housing.

8. The method of claim 7, wherein each of the plurality of support pins include a flared end.

9. A method of positioning a substrate, comprising:
lowering a support pedestal disposed in a processing chamber to a position such that a plurality of support pins suspended in openings in the support pedestal contact a bottom surface of the processing chamber;
further lowering the support pedestal while each of the plurality of support pins are guided along one or more of a plurality of rolling surfaces;
extending a robot having a substrate thereon into the processing chamber to a position above the support pins;

lowering the robot until the substrate rests on the support pins;
retracting the robot from the processing chamber; and
raising the support pedestal to a position in contact with the substrate, wherein each of the plurality of rolling surfaces are disposed in a housing having a longitudinal bore and a plurality of windows between the bore and an outer diameter of the housing, the housing having one or more cut-outs formed between the outer diameter of the housing and at least one of the plurality of windows.

* * * * *

UNITED STATES PATENT AND TRADEMARK OFFICE
CERTIFICATE OF CORRECTION

| | | |
|---|---|---|
| PATENT NO. | : 8,216,422 B2 | Page 1 of 1 |
| APPLICATION NO. | : 11/044245 | |
| DATED | : July 10, 2012 | |
| INVENTOR(S) | : Kurita et al. | |

It is certified that error appears in the above-identified patent and that said Letters Patent is hereby corrected as shown below:

Column 3, Line 23, please delete "1108" and insert -- 110B -- therefor.

Signed and Sealed this
Thirtieth Day of October, 2012

David J. Kappos
*Director of the United States Patent and Trademark Office*